United States Patent [19]

Umeda et al.

[11] Patent Number: 5,138,426
[45] Date of Patent: Aug. 11, 1992

[54] CERAMIC JOINED BODY

[75] Inventors: Yuji Umeda; Tadashi Otagiri; Go Suzuki, all of Nagoya, Japan

[73] Assignee: NGK Insulators, Ltd., Japan

[21] Appl. No.: 410,128

[22] Filed: Sep. 20, 1989

[30] Foreign Application Priority Data

Sep. 22, 1988 [JP] Japan ................. 63-236593

[51] Int. Cl.⁵ ........................... H01L 23/08
[52] U.S. Cl. ...................... 357/67; 357/71; 357/80
[58] Field of Search ............ 357/68, 67, 74, 80, 357/71

[56] References Cited

U.S. PATENT DOCUMENTS

| | | | |
|---|---|---|---|
| 4,323,405 | 4/1982 | Uno et al. | 357/80 |
| 4,459,166 | 7/1984 | Dietz et al. | 357/67 R |
| 4,517,584 | 5/1985 | Matsushita et al. | 357/80 |
| 4,746,583 | 5/1988 | Falanga | 428/632 |
| 4,761,345 | 8/1988 | Sato et al. | 357/80 |
| 4,784,974 | 11/1988 | Butt | 357/73 |
| 4,796,083 | 1/1989 | Cherukuri et al. | 357/73 |
| 4,806,160 | 2/1989 | Hagiwara et al. | 106/1.12 |
| 4,833,102 | 5/1989 | Byrne et al. | 437/218 |
| 4,882,212 | 11/1989 | Singhdeo et al. | 357/73 |
| 4,906,514 | 3/1990 | Francis et al. | 428/209 |
| 4,963,187 | 10/1990 | Kondo et al. | 106/1.14 |

FOREIGN PATENT DOCUMENTS

| | | |
|---|---|---|
| 54-128275 | 10/1979 | Japan . |
| 55-30815 | 3/1980 | Japan . |
| 59-92552 | 5/1984 | Japan . |
| 62-47153 | 2/1987 | Japan ............ 357/73 |
| 62-98649 | 5/1987 | Japan . |
| 62-290158 | 12/1987 | Japan . |
| 63-136654 | 6/1988 | Japan . |
| 63-229843 | 9/1988 | Japan . |
| 2135513 | 8/1984 | United Kingdom . |

OTHER PUBLICATIONS

Magdo, "Semiconductor encapsulation", IBM TDB, vol. 20, No. 10, Mar./78, pp. 3903-3904.

Primary Examiner—Andrew J. James
Assistant Examiner—Viet Q. Nguyen
Attorney, Agent, or Firm—Parkhurst, Wendel & Rossi

[57] ABSTRACT

In a ceramic joined body wherein a first metalizing layer formed on a surface of an aluminum nitride member on which semiconductor elements are installed and a second metalizing layer formed on a surface of an insulation substrate fireable at low temperatures are joined with each other via a solder used at high temperatures, an intermediate layer including a predetermined metal component and a predetermined glass component is arranged between the insulation substrate and the second metalizing layer. The glass component is melted into the insulation substrate during the firing operation, and thus a sufficient connection strength between the insulation substrate and the aluminum nitride member can be obtained. Moreover, the metal component and the glass component function to make the thermal expansion coefficient an intermediate value between the insulation substrate and the first metalizing layer, and thus heat stress generated during the brazing operation can be eliminated.

5 Claims, 1 Drawing Sheet

FIG_1a
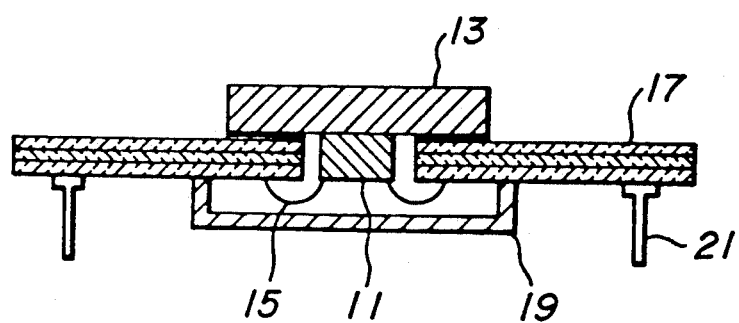
FIG_1b
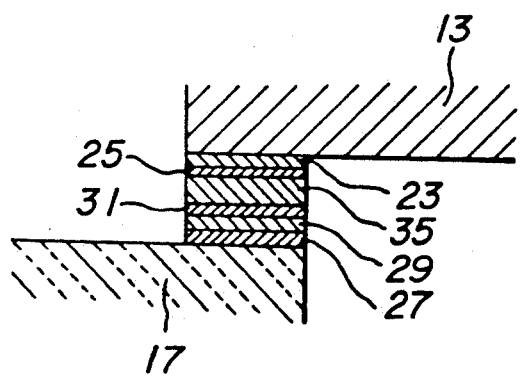

CERAMIC JOINED BODY

BACKGROUND OF THE INVENTION

Field of the Invention and Related Art Statements

The present invention relates to a ceramic joined body preferably used for a package of integrated circuits, wherein a metalizing layer formed on a surface of an aluminum nitride member and a metalizing layer formed on a surface of a low temperature fireable insulation substrate are joined with each other through a solder used under high temperatures.

Usually, as to a package substrate used for an IC package on which semiconductor chips having high generation of heat are installed, aluminum nitride (AlN) having a high heat conductivity has been used. However, since AlN has a large dielectric constant such as $\epsilon \approx 8.8$, there is a drawback that signal propagation characteristics are deteriorated. Moreover, since a firing temperature of AlN is high, it is necessary to use metal materials having high melting points such as tungsten (W) and molybdenum (Mo) as wiring conductors. In this case, since the wiring conductors made of the metal materials mentioned above have a high resistivity, there is a drawback that a signal propagation delay of a wiring substrate becomes large and a high integration of the wiring substrate can not be realized.

To eliminate the drawbacks mentioned above, there has been proposed a method such that an aluminum nitride member having high heat conductivity is compounded with an insulation substrate fireable at low temperatures (for example, crystallized glass or glass-ceramic composite body) which can use a wiring conductor having a low resistivity such as Cu, Ag, Au, Ag-Pd.

In order to connect the AlN substrate and the insulation substrate fireable at low temperatures, there has been known a method of forming a metalizing layer made of W and/or Mo on the AlN substrate, forming a metalizing layer made of copper, nickel etc. and connecting the AlN substrate and the insulation substrate fireable at low temperatures through solder used under high temperatures, such as silver solder (for example, 72 wt. % Ag-Cu eutectic alloy, melting point: 780° C).

However, in the method mentioned above wherein the AlN substrate and the insulation substrate fireable in at low temperatures are brazed with each other through the metalizing layer by using the solder used under high temperatures, residual heat stresses due to the brazing operation remain in the substrates. Therefore, the metalizing layer is peeled off from the side of the insulation substrate fireable at low temperatures having a low flexural strength or the composite body is easily broken from the metalizing layer. Therefore, there is a drawback that a sufficient connection strength between the AlN substrate and the insulation substrate fireable at low temperatures can not be obtained.

To eliminate drawback mentioned above, the Japanese Patent Application Laid-open Publication No. 62-290158 discloses a composite body between materials having high heat conductivity such as AlN, SiC, etc. and alumina, mullite or a low temperature fireable substrate. In this case, a spacer made of Cu/W, W, etc., which has an intermediate thermal expansion coefficient between those of the high heat conductive materials and the low temperature fireable substrate, is arranged therebetween so as to prevent the generation of cracks and flexures due to the residual stresses generated during the high temperature brazing operation.

However, even if the residual stresses are reduced by using a predetermined spacer as mentioned above, a sufficient connection strength still can not be obtained.

Further, in U.S. Pat. No. 4,695,517, a first layer including W, Mo and a second layer including only W, Mo are co-fired with an AlN substrate so as to increase a connection strength between a metalizing layer and the AlN substrate.

However, in technique disclosed in the U.S. Pat. No. 4,695,517, since use is made of W, Mo as conductors in the metalizing layer, it is not applicable to substrates fireable at low temperatures.

SUMMARY OF THE INVENTION

An object of the present invention is to eliminate the drawbacks mentioned above and to provide a ceramic joined body which has sufficient connection strength.

According to the invention, a ceramic joined body wherein a first metalizing layer formed on a surface of an aluminum nitride member and a second metalizing layer formed on a surface of an insulation substrate fireable at low temperatures are joined with each other via a solder used in high temperatures, comprises an intermediate layer formed between the insulation substrate fireable in low temperatures and the second metalizing layer; the intermediate layer includes a metal component consisting of at least one material selected from the group consisting of Cu, Ag, Au, Ag-Pd and Ni and a glass component consisting of the same material as that of the insulation substrate. The second metalizing layer mainly consist of the metal component in the intermediate layer.

In the construction mentioned above, glass components in the intermediate layer formed between the insulation substrate and the second metalizing layer formed on a surface of the insulation substrate are melted into the insulation substrate during the firing operation. As a result, a connection strength between the metalizing layer and the insulation substrate increases, and metal components in the intermediate layer function to increase a wettability between the metalizing layer and the insulation substrate. Therefore, a connection strength, after the brazing operation, between the AlN member and the insulation substrate also can be increased.

In this case, other components which may be contained in the intermediate layer except for the metal component are $Al_2O_3$, $ZrO_2$, mullite, cordierite, quartz etc. except for the glass component (including crystallized glass) in the insulation substrate, and these components do not affect the advantages according to the invention. That is to say, if an addition of the metal components shows anchor effects of the metalizing layer with respect to the insulation substrate, the composition mentioned above is not limited at all. In this case, when an amount of the metal components included in the intermediate layer is 20~80 vol %, the anchor effect mentioned above is predominant, and thus a connection strength after the brazing operation can be maintained at a sufficient level.

Since the thermal expansion coefficient of the AlN member is $4 \sim 4.5 \times 10^{-6}$/°C., it is preferred that use is made of the insulation substrate whose thermal expansion coefficient is $2 \sim 6.5 \times 10^{-6}$/°C. so as to match the thermal expansion coefficients between the AlN member and the insulation substrate.

Moreover, the metalizing layer formed on the AlN member which includes Mo and W as a main component may be formed on the fired AlN member or may be formed by co-firing with the non-fired AlN member.

BRIEF DESCRIPTION OF THE DRAWINGS

FIGS. 1a and 1b are a cross sectional view and a partly enlarged cross sectional view respectively showing one embodiment of a ceramic joined body according to the invention.

DESCRIPTION OF THE PREFERRED EMBODIMENTS

One embodiment according to the present invention will be explained with reference to FIGS. 1a and 1b.

First, an insulation substrate fireable in low temperatures will be explained. As for a glass composition of the insulation substrate, two kinds of glasses having a low melting point shown in Table 1 as specimen Nos. 1 and 2 are prepared.

TABLE 1

| | Glass composition (wt %) | |
|---|---|---|
| | No. | |
| component | 1 | 2 |
| $SiO_2$ | 75 | 45 |
| $Al_2O_3$ | 3 | 28 |
| $B_2O_3$ | 14 | 5 |
| $Li_2O$ | — | — |
| $Na_2O$ | 1 | — |
| $K_2O$ | 3 | — |
| BaO | 4 | — |
| MgO | — | 14 |
| $ZrO_2$ | — | 3 |
| $P_2O_5$ | — | 5 |
| softening temperature (°C.) | 806 | — |
| dielectric constant (1 MHz) | 4.7 | 5.3 |
| thermal expansion coefficient ($\times 10^{-6}$/°C.) | 3.5 | 2.0 |

In alumina powder and a quartz glass powder are then mixed with the glass powder mentioned above in the manner as shown in Table 2 so as to obtain insulation substrates shown in Table 2 as specimen Nos. 3 and 4.

Next, one method of manufacturing an IC package shown in FIG. 1a, wherein an AlN substrate and an insulation substrate fireable at low temperatures are connected with each other, will be explained. The IC package shown in FIG. 1a comprises an AlN substrate 13 on which a semiconductor element 11 is installed, an insulation substrate fireable at low temperatures 17 in which wiring conductors are formed, the wiring conductors being connected to the semiconductor element 11 via bonding conductors 15, a cap 19 airtightly connected to the insulation substrate 17 and lead pins 21 secured to the insulation substrate 17.

In the IC package mentioned above, one embodiment of the connection between the AlN substrate and the insulation substrate will be further explained with reference to the enlarged cross sectional view shown in FIG. 1b.

(1) Step of forming a connection pad on the AlN substrate;

(a) First, $Al_2O_3$ layer having a thickness of about 10 μm was formed on a surface of the AlN substrate 13 by oxidization. Then, Mo-Mn paste was prepared by mixing 100 parts of Mo, 5 parts of Mn, 2 parts of $Al_2O_3$, 5 parts of $SiO_2$ and a binder of ethyl cellulose system. The thus obtained Mo-Mn paste was printed on the AlN substrate 13, and then fired in a reduction atmosphere having a dew point of 40° C. at a maximum temperature of 1300° C. so as to form a metalizing layer 23.

(b) Then, an Ni plating layer 25 having a thickness of 0.5~10 μm was formed on the metalizing layer 23 of the fired AlN substrate 13 by an electroplating method.

(2) Step of forming a connection pad on the insulation substrate fireable at low temperatures 17;

(a) First, green sheets made of ceramic compositions shown in Table 2 were formed by the doctor blade method.

(b) Then, an intermediate layer 27 and a metalizing layer 29 were arranged successively on the thus obtained green sheet. In this case, as for the intermediate layer 27, use was made of a paste obtained in a triroll mill by mixing Cu or Ag-Pd having an average particle size of 0.5~2 μm with the ceramic compositions shown in Table 3 having an average particle size of 1~3 μm together with an acrylic binder and a terpineol solvent at a mixing ratio shown in Table 3.

TABLE 2

| | Composition of insulation substrate fireable in low temperatures | | | | |
|---|---|---|---|---|---|
| No. | Composition (wt %) | Firing temperature (°C.) | Dielectric constant (1 MHz) | Flexural strength (kg/mm²) | Thermal expansion coefficient ($\times 10^{-6}$/°C.) (RT-300° C.) |
| 3 | No. 1  40<br>quartz glass  30<br>alumina  30 | 1000 | 5.4 | 19 | 4.3 |
| 4 | No. 2  100 | 920 | 5.3 | 17 | 2.5 |

TABLE 3

| | | Intermediate layer | | | | | | | Adhesion strength with respect to AlN substrate (kg/mm²) |
|---|---|---|---|---|---|---|---|---|---|
| | | Ceramic composition (wt %) | | | Ceramic total amount (Vol %) | Metal composition (Vol %) | | Metalizing layer | Firing temperature (°C.) |
| | Substrate | boro-silicate glass | crystal-lized glass | alumina | | Cu total amount | Ag—Pd total amount | | | |
| 1 | borosilicate glass | 40 | — | 60 | 56.1 | 43.9 | — | Cu | 1000 | 4.3 |
| 2 | + quartz glass | 30 | — | 70 | 54.5 | 45.5 | — | Cu | 1000 | 6.5 |
| 3 | + alumina | 20 | — | 80 | 79.7 | 20.3 | — | Cu | 1000 | 3.1 |
| 4 | | 20 | — | 80 | 68.2 | 31.8 | — | Cu | 1000 | 5.2 |
| 5 | | 20 | — | 80 | 63.6 | 36.4 | — | Cu | 1000 | 5.9 |
| 6 | | 20 | — | 80 | 52.9 | 47.1 | — | Cu | 1000 | 7.3 |
| 7 | | 20 | — | 80 | 39.6 | 60.4 | — | Cu | 1000 | 6.6 |

TABLE 3-continued

| | Intermediate layer | | | | | | | Adhesion strength with respect to AlN substrate (kg/mm²) |
|---|---|---|---|---|---|---|---|---|
| | Ceramic composition (wt %) | | | Ceramic total amount (Vol %) | Metal composition (Vol %) | | Metalizing layer | Firing temperature (°C.) |
| Substrate | borosilicate glass | crystallized glass | alumina | | Cu total amount | Ag—Pd total amount | | |
| 8 | 20 | — | 80 | 31.6 | 68.4 | — | Cu | 1000 | 5.0 |
| 9 | 20 | — | 80 | 22.5 | 77.5 | — | Cu | 1000 | 3.5 |
| 10 | 10 | — | 90 | 51.0 | 49.0 | — | Cu | 1000 | 7.6 |
| 11 | 5 | — | 95 | 50.1 | 49.9 | — | Cu | 1000 | 4.8 |
| 12 | 20 | — | 80 | 52.9 | 47.1 | — | Cu | *1) | 3.6 |
| 13 | 20 | — | 80 | 15.0 | 85.0 | — | Cu | 1000 | 2.2 |
| 14 | 20 | — | 80 | 10.0 | 90.0 | — | Cu | 1000 | 1.7 |
| 15 | 20 | — | 80 | 83.5 | 16.5 | — | Cu | 1000 | 2.6 |
| 16 | 20 | — | 80 | 92.0 | 8.0 | — | Cu | 1000 | 1.8 |
| 17 | crystallized glass | — | 60 | 40 | 70.0 | — | 30 | Ag—Pd | 920 | 4.6 |
| 18 | | — | 60 | 40 | 60.0 | — | 40 | Ag—Pd | 920 | 5.6 |
| 19 | | — | 60 | 40 | 46.7 | — | 53.3 | Ag—Pd | 920 | 5.7 |
| 20 | | — | 40 | 60 | 57.9 | — | 42.1 | Ag—Pd | 920 | 4.1 |

*1) After fired the ceramic substrate at 1000° C., intermediate layer and metalizing layer were fired at 950° C Further, as for the metalizing layer 29, use was made of a paste obtained in a triroll mill by mixing a metal component such as Cu or Ag-Pd with an acrylic binder and a terpineol solvent. Then, pastes for the intermediate layer 27 and the metalizing layer 29 were screen-printed on the green sheets successively. The thickness of these layers was about 10 μm.

(c) Then, the green sheets, on which the intermediate layer 27 and the metalizing layer 29 were formed, were co-fired with each other at a temperature of about 900~1000° C. In this case, the metalizing layer 29 including Cu component was fired in a nitrogen atmosphere at 1000° C. Moreover, the metalizing layer 29 including Ag-Pd component was fired in the atmosphere at 920° C.

(d) Then, an Ni plating layer 31 having a thickness of 0.5~10 μm was arranged by the electroplating method on the metalizing layer 29 of the thus fired insulation substrate 17.

(3) Finally, the connection pads of the AlN substrate 13 and the insulation substrate 17 fireable at low temperatures were brazed with each other in a nitrogen atmosphere at 800° C. by utilizing Ag 28 wt % - Cu eutectic Ag solder 35.

In order to examine the adhesion strength of the connection bodies between the AlN substrate and the low temperature fireable substrate, the substrates of the connection body specimen formed in the method mentioned above were pulled mutually in a reverse direction at a tensile speed of 0.5 mm/min., and a tensile strength was measured when the substrates were peeled off mutually. The results of the tensile strengths also are shown in Table 3. As clearly understood from Table 3, when a total amount of metal components in the intermediate layer 27 is 20~80 vol %, a sufficient connection strength, such as a tensile strength of more than about 3 kg/mm² can be obtained. Further, a sufficient connection strength also can be obtained in the following cases: when the insulation substrate 17, the intermediate layer 27 and the metalizing layer 29 are co-fired, or when the intermediate layer 27 and the metalizing layer 29 are fired after the insulation substrate 17 is fired.

Moreover, in the comparison specimen wherein no intermediate layer was formed, the specimen was peeled off from the metalizing layer in the brazing operation, or the insulation substrate near the metalizing layer was broken. Therefore, the tensile test mentioned above was not performed.

The present invention is not limited to the embodiments mentioned above, but various modifications can be performed within the scope of the invention.

As clearly understood from the above, according to the invention, since the intermediate layer including predetermined amounts of metal component and ceramic component is arranged between the insulation substrate fireable at low temperatures, and the metalizing layer, it is possible to reduce the effects of the residual heat stress generated in the insulation substrate due to a heating in the brazing operation with respect to the AlN member. Further, since the ceramic components in the intermediate layer are melted into the insulation substrate, a sufficient connection strength can be obtained.

What is claimed is:

1. A ceramic joined body comprising:
   an aluminum nitride substrate;
   a first metallizing layer formed on at least a portion of a surface of said aluminum nitride substrate;
   an insulation substrate fireable at low temperatures, said substrate comprising at least one material selected from the group consisting of glass and ceramic;
   an intermediate layer formed on at least a portion of a surface of said insulation substrate, said intermediate layer comprising a metal component containing at least one metal selected from the group consisting of Cu, Ag, Au, Ag-Pd and Ni, and a component comprising said at least one material selected from the group consisting of glass and ceramic;
   a second metallizing layer formed on said intermediate layer and consisting essentially of the same metal component comprising said intermediate layer; and
   a high temperature solder joining said first metallizing layer to said second metallizing layer.

2. The ceramic joined body of claim 1 wherein said metal component is present in said intermediate layer in an amount of 20~80% by volume.

3. The ceramic joined body of claim 1, wherein said insulation substrate comprises a material selected from the group consisting of glass-ceramic composite and crystallized glass.

4. The ceramic joined body of claim 3, wherein said insulation substrate has a thermal expansion coefficient of $2 \sim 6.5 \times 10^{-6}$/°C.

5. The ceramic joined body of claim 1, wherein said first metallizing layer consists essentially of at least one metal selected from the group consisting of Mo and W.

* * * * *